United States Patent
Fu et al.

(10) Patent No.: US 11,538,923 B2
(45) Date of Patent: Dec. 27, 2022

(54) METHOD FOR ETCHING BACK HARD MASK LAYER ON TOPS OF DUMMY POLYSILICON GATES IN GATE LAST PROCESS

(71) Applicant: SHANGHAI HUALI INTEGRATED CIRCUIT CORPORATION, Shanghai (CN)

(72) Inventors: Shidong Fu, Shanghai (CN); Ran Huang, Shanghai (CN); Bohan Jiang, Shanghai (CN); Ying Xu, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 36 days.

(21) Appl. No.: 17/242,940

(22) Filed: Apr. 28, 2021

(65) Prior Publication Data
US 2022/0102531 A1     Mar. 31, 2022

(30) Foreign Application Priority Data
Sep. 30, 2020    (CN) .......................... 202011056627.0

(51) Int. Cl.
    *H01L 29/66*     (2006.01)
    *H01L 21/02*     (2006.01)
    (Continued)

(52) U.S. Cl.
    CPC .. *H01L 29/66545* (2013.01); *H01L 21/02532* (2013.01); *H01L 21/0332* (2013.01);
    (Continued)

(58) Field of Classification Search
CPC ......... H01L 29/66545–6656; H01L 29/66871; H01L 29/66606; H01L 21/027–0271; H01L 21/0332–0337; H01L 21/308–3088; H01L 21/31–31144; H01L 21/32; H01L 21/32139; H01L 21/467; H01L 21/823842; H01L 27/0922; H01L 21/823456; H01L 21/823828; H01L 21/82385; H01L 29/0847; H01L 21/31058
See application file for complete search history.

(56) References Cited

U.S. PATENT DOCUMENTS

| | | | | |
|---|---|---|---|---|
| 2012/0313187 A1* | 12/2012 | Baars | .................. | H01L 29/6659 257/E21.294 |
| 2018/0219081 A1* | 8/2018 | Greene | ............. | H01L 29/42376 |

* cited by examiner

*Primary Examiner* — Sonya McCall-Shepard
(74) *Attorney, Agent, or Firm* — Alston & Bird LLP

(57) ABSTRACT

A method for etching back a hard mask layer on top of dummy polysilicon gates in a gate last process comprises: step 1: forming a plurality of dummy gate structures; step 2: depositing a spin-on carbon (SOC) layer to fill the space regions between the sidewalls of the dummy gate structures to a level above the top surface of each of the plurality of dummy gate structures; step 3: performing a first etching-back to the spin-on carbon layer to remove the SOC layer outside the space regions and keep the SOC layer in the space regions below the top surfaces of each of dummy polysilicon gate; step 4: performing a second etching-back by using the remaining spin-on carbon layer as a mask to remove the hard mask layer and the sidewalls of the dummy polysilicon gates on both sides of the hard mask layer at the same time; step 5: removing the SOC layer. This technique saves one photomask and improves the process window.

13 Claims, 3 Drawing Sheets

(51) Int. Cl.
*H01L 21/033* (2006.01)
*H01L 21/311* (2006.01)
*H01L 21/8238* (2006.01)
*H01L 27/092* (2006.01)
*H01L 29/08* (2006.01)
*H01L 29/161* (2006.01)
*H01L 29/423* (2006.01)

(52) U.S. Cl.
CPC .. *H01L 21/31144* (2013.01); *H01L 21/82385* (2013.01); *H01L 21/823814* (2013.01); *H01L 21/823878* (2013.01); *H01L 21/823892* (2013.01); *H01L 27/0928* (2013.01); *H01L 29/0847* (2013.01); *H01L 29/161* (2013.01); *H01L 29/42376* (2013.01); *H01L 29/66636* (2013.01)

METHOD FOR ETCHING BACK HARD MASK LAYER ON TOPS OF DUMMY POLYSILICON GATES IN GATE LAST PROCESS

CROSS-REFERENCES TO RELATED APPLICATIONS

This application claims priority to Chinese patent application No. CN202011056627.0, filed on Sep. 30, 2020, and entitled "METHOD FOR ETCHING BACK HARD MASK LAYER ON TOPS OF DUMMY POLYSILICON GATES IN GATE LAST PROCESS", the disclosure of which is incorporated herein by reference in entirety.

TECHNICAL FIELD

The present application relates to the field of semiconductor integrated circuit manufacturing, and in particular, to methods of making top of dummy polysilicon gates in a gate last process.

BACKGROUND

With continuous reduction of process nodes in semiconductor integrated circuit manufacturing, a gate structure is commonly formed by superposing a high-dielectric-constant (HK) layer and a metal gate (MG), referred to as HKMG technology. One existing method for forming the HKMG is a gate last process. In the gate last process, dummy gate structures with dummy polysilicon gates are often adopted as a self-alignment technique to form sidewall structures, source regions and drain regions. Later the dummy polysilicon gates are removed, and then metal gates are formed in regions where the dummy polysilicon gates are removed. A hard mask layer is usually applied to define the dummy polysilicon gates, so it becomes necessary to remove the hard mask layer before the dummy polysilicon gates are removed. However, the removal process of the dummy polysilicon gates is usually performed after a contact-etch-stop-layer (CESL) and an interlayer film, usually the zeroth interlayer film, are formed. Therefore, it is necessary to remove the contact-etch-stop-layer on top of the dummy polysilicon gates when performing the chemical-mechanical polishing (CMP) process on the interlayer film, and the dummy polysilicon gates can be completely removed only after the contact-etch-stop-layer on top of the dummy polysilicon gates is removed. However, in the existing gate last process such as in the 28 nm note with HKMG process, usually a large horn is formed after etching the hard mask layer, making it impossible to completely remove the contact-etch-stop-layer on top of the dummy polysilicon gates in the chemical-mechanical polishing process of the interlayer film, resulting in leaving polysilicon residue at the gate, severely affecting device performance. To overcome the problem above, an existing method adopts a photoresist etching-back (PREB) process to remove the hard mask layer on top of the polysilicon gates.

FIGS. 1A to 1D illustrate structural views of a device after each step in applying a PREB method for etching back a hard mask layer 105 on top of dummy polysilicon gates 104 in a gate last process. The existing method for etching back the hard mask layer 105 on top of the dummy polysilicon gates 104 in the gate last process includes the following steps:

In step 1, referring to FIG. 1A, forming dummy gate structures by superposing a gate dielectric layer 103, dummy polysilicon gates 104 and a hard mask layer 105 on a semiconductor substrate 101.

Forming sidewalls 106 on the side surfaces of the dummy gate structures, herein the top surfaces of the sidewalls 106 are configured to be higher than the top surfaces of the dummy polysilicon gates 104 but lower than or level to the top surface of the hard mask layer 105.

Spacing regions are formed between the sidewalls 106 of the dummy gate structure. The dummy gate structures have different widths and the spacing regions also have different widths over the same semiconductor substrate 101, so the pattern densities are not even across the substrate.

Generally, the semiconductor substrate 101 is a silicon substrate.

The hard mask layer 105 is formed by superposing a first nitride layer 105a and a second oxide layer 105b.

The sidewalls 106 are double-layer sidewalls, they are formed by superposing an oxide layer and a nitride layer. The sidewalls 106 may also be other structures composed of an oxide layer or a nitride layer, for example, single oxide-layer sidewalls, single-nitride-layer sidewalls, or sidewalls formed by superposing a stack of oxide layers and nitride layers.

The gate dielectric layer 103 includes a high-dielectric-constant layer. An interface layer is also formed at the bottom of the high-dielectric-constant layer. A barrier layer is formed at the top of the high-dielectric-constant layer. The material of the high-dielectric-constant layer may include hafnium oxide (HfO2), and the interface layer may include silicon oxide (SiO2).

Generally, the method further includes a step of forming a field oxide layer 102 in the semiconductor substrate 101 before forming the dummy gate structures, and the field oxide layer 102 separates the active regions of the devices.

The active regions include an active region for a core region and an active region for an input/output region.

The semiconductor device includes a core device and an input/output device, the core device is formed in the core region, and the input/output device is formed in the input/output region.

The width of the dummy gate structure of the input/output device is greater than the width of the dummy gate structure of the core device.

The core device includes a first N-type field effect transistor 201 and a first P-type field effect transistor 202.

The input/output devices include a second N-type field effect transistor 203 and a second P-type field effect transistor 204.

Step 1 further includes a step of forming P-wells and N-wells in selected regions of the semiconductor substrate 101, the P-wells are formed in the first N-type field effect transistor 201 and the second N-type field effect transistor 203, and the N-wells are formed in the first P-type field effect transistor 202 and the second P-type field effect transistor 204.

After the sidewalls 106 are formed, step 1 further includes a step of forming source regions and drain regions in the active regions on the two sides of the dummy gate structures. The source regions and the drain regions are doped through corresponding source and drain ion implantation, the first N-type field effect transistor 201 and the second N-type field effect transistor 203 apply N-type source and drain implantation, and the first P-type field effect transistor 202 and the second P-type field effect transistor 204 apply P-type source and drain implantation. Generally, before the sidewalls 106 are formed, step 1 further includes performing lightly doped drain (LDD) implantation.

The step of forming the source regions and the drain regions of the first P-type field effect transistor 202 and the second P-type field effect transistor 204 further includes a step of forming an embedded silicon germanium (SiGe) epitaxial layer 107. The embedded silicon germanium epitaxial layer 107 is realized by forming recesses such as Σ-shaped recesses in the two sides of the dummy gate structures corresponding to the first P-type field effect transistor 202 and the second P-type field effect transistor 204, and then filling the recesses with a silicon germanium epitaxial layer. Finally, the source regions and drain regions of the first P-type field effect transistor 202 and the second P-type field effect transistor 204 are formed in the embedded silicon germanium epitaxial layer 107. The embedded silicon germanium epitaxial layer 107 can improve the hole mobility of the P-type field effect transistors, thus improving the performance of the P-type field effect transistors.

The height of the dummy gate structures is influenced in the process of forming the embedded silicon germanium epitaxial layer 107. FIG. 1A shows that the heights of the dummy gate structures of the first P-type field effect transistor 202 and the second P-type field effect transistor 204 are reduced compared to the N-type field effect transistors 201 and 203.

After the source regions and the drain regions are formed, step 1 further includes a step of forming salicide 108 on the surfaces of the source regions and the drain regions.

Then step 1 further includes a step of forming a third nitride layer 109, and the third nitride layer 109 covers the top surfaces of the dummy gate structures, the top surfaces of the sidewalls 106 corresponding to the dummy gate structures and the surfaces of the spacing regions.

In step 2, referring to FIG. 1A, a photoresist 110 is coated to fill and extend the spacing regions between the dummy gate structures to a level above the surfaces of all dummy gate structures.

Referring to FIG. 1A, the width of each dummy gate structure and the spacings between two of the dummy gate structures in the core region are smaller than the width of each dummy gate structure and the spacings between any two of the dummy gate structures in the input/output region, so the average distribution density of the semiconductor devices in the core region is greater than that in the input/output region. The thickness of the photoresist 110 depends on distribution density of the semiconductor devices in each region, which leads to uneven top surface of the photoresist 110, thus the photoresist in the input/output region becomes thicker and its top surface is higher than the photoresist in the core region.

In step 3, referring to FIG. 1B, as the above described, the photoresist 110 has different thicknesses in different regions, so it has different etch loading in different regions. The etch loading is larger in regions where the semiconductor devices are distributed relatively sparsely, such as the input/output. regions As a result, when the first etching-back is performed directly, it is possible that the photoresist 110 on top of the dummy gate structures in the input/output region has not been completely removed but the thickness thinning of the photoresist 110 in the spacing regions in the core region reaches a required lower limit. As an example, the photoresist 110 on top of the dummy gate structures with widths greater than 300 Å is all directly removed. Therefore, it is necessary to remove the photoresist 110 on top of the dummy gate structures in the input/output area by adding a mask before subsequent first etching-back is performed.

Referring to FIG. 1C, the first etching-back is performed to the photoresist 110. After the first etching-back is completed, the photoresist 110 is only located in the spacing regions and the photoresist 110 outside the spacing regions is all removed.

Because of the limitation of the etch selection ratio of the photoresist 110 to the hard mask layer in the subsequent second etching-back, the photoresist 110 will be thinned in the subsequent second etching-back. Therefore, one needs to consider the influence of thinning in the second etching-back on the thickness d101 of the photoresist 110 after the first etching-back, that will make the thickness d101 relatively large. When the thickness d101 is relatively large, a photoresist residue 205 will be formed on the side surfaces of the sidewalls 106. The photoresist residue 205 makes it easy to form a horn in the subsequent second etching-back process.

In step 4, referring to FIG. 1D, second etching-back is performed by using the photoresist 110 as a mask to finish etching of the hard mask layer 105. The second etching-back completes synchronous etching of the sidewalls 106 on both sides of the hard mask layer 105 at the same time. Generally, the second etching-back process completely removes the second oxide layer 105*b* but reserves the first nitride layer 105*a*.

Because of the presence of the photoresist residue 205 after the first etching-back, a horn as illustrated and enclosed in a dashed-lined circle 206 remains after the second etching-back process.

In the first etching-back process, although it is possible to decrease the photoresist residue 205 and thereby decrease the horn 205 by increasing the etching amount of the photoresist 110, the thickness d102 of the photoresist 110 as illustrated in FIG. 1D will also decrease after the second etching-back decreases the thickness d101. If d102 is too thin, the surface structure of the semiconductor substrate on both sides of the dummy gate structures cannot be protected. For example, the embedded silicon germanium epitaxial layer 107 may not be protected very well. The existing method faces the challenge that the thickness d101 needs to be reduced to reduce the horn, but the subsequent thickness d101 should not be too small so d102 has to meet certain thickness requirement to protect the surface structure of the semiconductor substrate. A proper process window of the first etching-back process has become small, and the process complexity and control difficulty have increased.

In step 5, the photoresist 110 is removed.

After step 5, the method further includes the following steps:

A contact-etch-stop-layer formed by a nitride layer is formed.

An interlayer film is formed.

A chemical-mechanical polishing process is performed to remove the interlayer film on the top of the dummy gate structures and make the interlayer film only located in the spacing regions. The chemical-mechanical polishing process realizes removing the contact-etch-stop-layer on the top of the dummy gate structure and opens the top of the dummy polysilicon gates 104 at the same time. In the existing method, since a large horn is easily produced after the second etching-back, it is easy to cause the residue of the contact-etch-stop-layer, i.e., the nitride layer, on the top of the dummy polysilicon gates 104 in the chemical-mechanical polishing process of the interlayer film, which is not conducive to the subsequent removal of the dummy polysilicon gates.

The dummy polysilicon gates 104 are removed. When the residue of the contact-etch-stop-layer is produced at the top of the dummy polysilicon gates 104, polysilicon residue is easily produced, that is, polysilicon cannot be easily removed.

Metal gates are formed in regions where the dummy polysilicon gates 104 are removed. Each metal gate includes a corresponding work function layer and an electrode connecting layer.

BRIEF SUMMARY

The technical problem to be solved by the present application is to provide a method for etching back a hard mask layer on top of dummy polysilicon gates in a gate last process, which can reduce the process complexity and control difficulty, can improve the process window, can save the photomask and can decrease the damage to the device.

To solve the technical problem, the method for etching back the hard mask layer on the top of the dummy polysilicon gates in the gate last process provided by the present application includes the following steps:

step 1: forming a plurality of dummy gate structures formed by superposing a gate dielectric layer, dummy polysilicon gates and a hard mask layer on a semiconductor substrate;

forming sidewalls on the side surfaces of the dummy gate structures, the top surfaces of the sidewalls being higher than the top surfaces of the dummy polysilicon gates and lower than or equal to the top surface of the hard mask layer;

spacing regions being formed between the sidewalls of the dummy gate structures;

the width of the dummy gate structures on the same semiconductor substrate including a plurality of widths, the width of the spacing regions including a plurality of widths;

step 2: depositing a spin-on carbon (SOC) layer to completely fill and extend the spacing regions between the dummy gate structures to a position above the surface of each dummy gate structure;

step 3: performing no-photomask defined first etching-back to the spin-on carbon layer, the spin-on carbon layer being only located in the spacing regions and the spin-on carbon layer outside the spacing regions being all removed after the first etching-back is completed;

the etch loading difference of the spin-on carbon layer in the distribution regions of the dummy gate structures with different widths and the spacing regions with different widths meeting the requirement of making the first etching-back be no-photomask defined one-step comprehensive etching;

the thickness of the spin-on carbon layer after the first etching-back meeting the requirement of protecting the surface structure of the semiconductor substrate in the spacing regions in subsequent second etching-back;

the spin-on carbon layer after the first etching-back also meeting the requirement of decreasing or eliminating a spin-on carbon layer residue adhered to the sidewalls, so as to ensure that the spin-on carbon layer is all located at a position below the top surfaces of the dummy polysilicon gates, such that no horn is formed or the height of a horn is small in subsequent second etching-back;

step 4: performing second etching-back by using the spin-on carbon layer as a mask to realize etching of the hard mask layer, the second etching-back realizing synchronous etching of the sidewalls on the two sides of the hard mask layer at the same time;

step 5: removing the spin-on carbon layer.

As a further improvement, the semiconductor substrate includes a silicon substrate.

As a further improvement, the hard mask layer is formed by superposing a first nitride layer and a second oxide layer.

As a further improvement, in step 4, the second etching-back process completely removes the second oxide layer and the first nitride layer is reserved.

As a further improvement, the material of the sidewalls includes a nitride layer or an oxide layer.

As a further improvement, the gate dielectric layer includes a high-dielectric-constant layer.

As a further improvement, before forming the dummy gate structures, step 1 further includes a step of forming a field oxide layer in the semiconductor substrate, and the field oxide layer separates to form active regions.

As a further improvement, the active regions include an active region corresponding to a core region and an active region corresponding to an input/output region;

the semiconductor device includes a core device and an input/output device, the core device is formed in the core region, and the input/output device is formed in the input/output region.

As a further improvement, the core device includes a first N-type field effect transistor and a first P-type field effect transistor;

the input/output device includes a second N-type field effect transistor and a second P-type field effect transistor.

As a further improvement, step 1 further includes a step of forming P-wells and N-wells in selected regions of the semiconductor substrate, the P-wells are formed in the forming regions of the first N-type field effect transistor and the second N-type field effect transistor, and the N-wells are formed in the forming region of the first P-type field effect transistor and the second P-type field effect transistor.

As a further improvement, after forming the sidewalls, step 1 further includes a step of forming source regions and drain regions in the active regions on the two sides of the dummy gate structures.

As a further improvement, the step of forming the source regions and the drain regions of the first P-type field effect transistor and the second P-type field effect transistor further includes a step of forming an embedded silicon germanium epitaxial layer.

As a further improvement, after forming the source regions and the drain regions, step 1 further includes a step of forming salicide on the surfaces of the source regions and the drain regions;

then step 1 further includes a step of forming a third nitride layer, the third nitride layer covering the top surfaces of the dummy gate structures, the top surfaces of the sidewalls corresponding to the dummy gate structures and the surfaces of the spacing regions.

As a further improvement, after step 5, the method for etching back the hard mask layer on the top of the dummy polysilicon gates in the gate last process further includes:

forming a contact-etch-stop-layer consisting of a nitride layer;

forming an interlayer film;

performing a chemical-mechanical polishing process to remove the interlayer film on the top of the dummy gate structures and make the interlayer film only located in the spacing regions, the chemical-mechanical polishing process realizing removing the contact-etch-stop-layer on the top of the dummy gate structures and opening the top of the dummy polysilicon gates at the same time;

removing the dummy polysilicon gates;

forming metal gates in regions where the dummy polysilicon gates are removed.

As a further improvement, the process node of the semiconductor device is less than 28 nm.

As a further improvement, the width of each of the dummy gate structures of the input/output device is greater than the width of one of the dummy gate structures of the core device.

Different from the existing process in which the photoresist etching-back (PREB) process loop is adopted to etch the hard mask layer on top of the dummy polysilicon gates, the present application adopts a spin-on carbon layer to replace the photoresist. This technique utilizes the characteristics that the etch loading difference of the spin-on carbon layer is small for different structure distributions, regardless of what the width and spacing differences are. Therefore, by adopting the spin-on carbon layer instead of the photomask, the one-step comprehensive etching-back process is achieved. This process is different from using the photomask to define the etch process, wherein etch loading of the photoresist in different density regions causes the photoresist etching-back process loop. In the current disclosure, no photomask needs to be adopted for definition. spin-on carbon Therefore, a layer of photomask is saved, reducing cost and process complexity and small process control windows.

The present application also utilizes the characteristics that the etch selection ratio of the spin-on carbon layer to the hard mask layer is smaller than the etch selection ratio of the photoresist to the hard mask layer, and can realize protecting the surface structure of the semiconductor substrate on both sides of each of the dummy gate structures, such as the embedded silicon germanium epitaxial layer, by adopting a thinner spin-on carbon layer in the second etching-back process, i.e., the etching-back process of the hard mask layer, such that the following technical effects can be further achieved at the same time.

First, compared with the existing method in which the first etching-back needs to ensure that the photoresist has a greater thickness, the etching thickness of the first etching-back in the present application can be more and the variation range of the etching thickness can be larger, so the present application can improve the process window of the first etching-back, and can further reduce the process complexity and control difficulty.

Second, the ability of protecting the surface structure of the semiconductor substrate on the two sides of the dummy gate structures can be improved, and the risk of damage to the surface structure of the semiconductor substrate on the two sides of the dummy gate structures, such as the germanium silicon epitaxial layer, can be reduced.

Third, since the thickness of the spin-on carbon layer can be further reduced after the first etching-back, and the spin-on carbon layer residue adhered to the sidewalls can be reduced or eliminated after the thickness of the spin-on carbon layer is reduced, no horn is formed or the height of a horn is smaller in the subsequent second etching-back, such that polysilicon residue can be prevented from being caused when the dummy polysilicon gates are removed subsequently.

In short, the present application can reduce the process complexity and narrow control window, can improve the process window, can save the photomask, can reduce the risk of damage to the device, and can ensure the process health.

BRIEF DESCRIPTION OF THE DRAWINGS

The present application will be further described below in detail in combination with the embodiments with reference to the drawings.

DETAILED DESCRIPTION OF THE APPLICATION

The following description enables readers to implement and use the present disclosure into specific application scenarios. Various modifications in different applications will be obvious to a person skilled in the art, and the general principles defined herein can be applied to embodiments in a relatively wide range. Therefore, the present disclosure is not limited to the embodiments given herein, but should be granted the broadest scope consistent with the principle and novel feature disclosed herein.

In the following detailed description, many specific details are set forth to provide a more thorough understanding of the present disclosure. However, it is obvious to a person skilled in the art that the practice of the present disclosure may not necessarily be limited to these specific details. In other words, certain structures and devices are shown in the form of block diagrams rather than in details, to avoid obscuring the present invention.

Readers should pay attention to all files and documents submitted along with this specification and open to the public for consulting this specification, and the contents of all of the files and documents are incorporated hereinto by reference. Unless otherwise directly stated, all the features disclosed in this specification (including any appended claims, abstract, and drawings) can be replaced by alternative features for achieving the same, equivalent, or similar purpose. Therefore, unless otherwise expressly stated, each feature disclosed is merely an example of a set of equivalent or similar features.

It should be noted that when used, the signs left, right, front, rear, top, bottom, front, back, clockwise, and counterclockwise are only used for the purpose of convenience, and do not imply any specific direction. In fact, they are used to reflect a relative position and/or orientation between various parts of an object.

As used herein, the terms "over", "under", "between", and "on" refer to a relative position of one layer relative to another layer. Likewise, for example, a layer deposited or placed over or under another layer may directly contact the other layer or may be separated from the other layer by one or more intermediate layers. Furthermore, a layer deposited or placed between layers may directly contact the layers or may be separated from the layers by one or more intermediate layers. In contrast, a first layer "on" a second layer is in contact with the second layer. In addition, a relative position of one layer relative to the other layers is provided (assuming that deposition, modification, and film removal operations are performed relative to a base substrate, regardless of the absolute orientation of the substrate).

Figure 2:
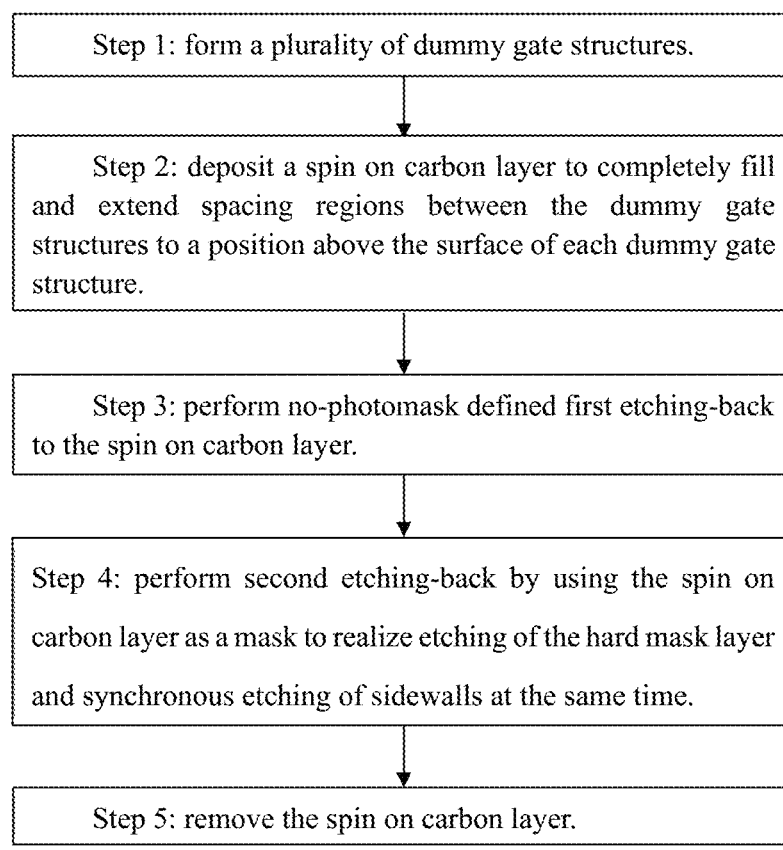
FIG. 2 is a flowchart of a method for etching back a hard mask layer on top of dummy polysilicon gates in a gate last process according to one embodiment of the present application.
Figure 3A:
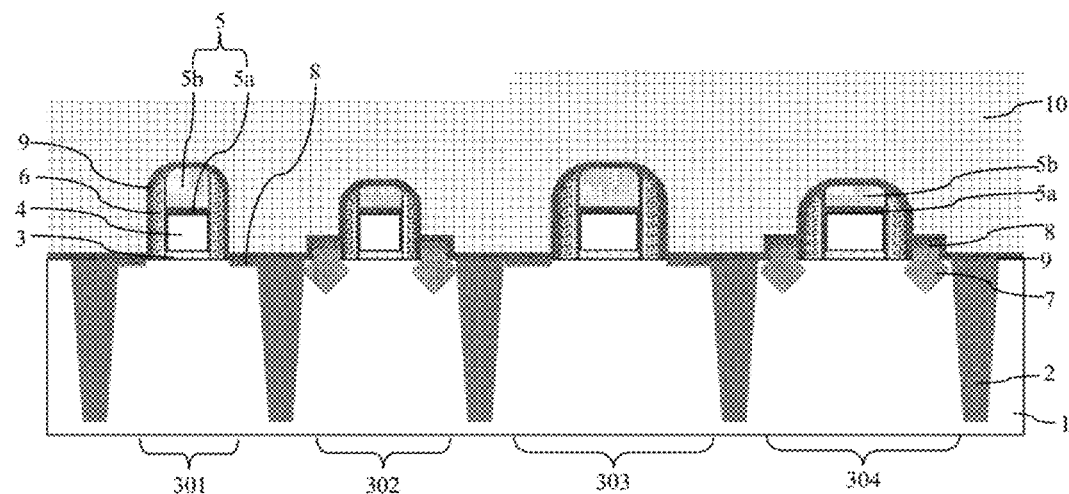
FIGS. 3A to 3C illustrate cross sectional views of the device structures after some major steps of the gate last process in which etching back the hard mask layer from top of the dummy polysilicon gates is performed, according to one embodiment of the present application.
Figure 3B:
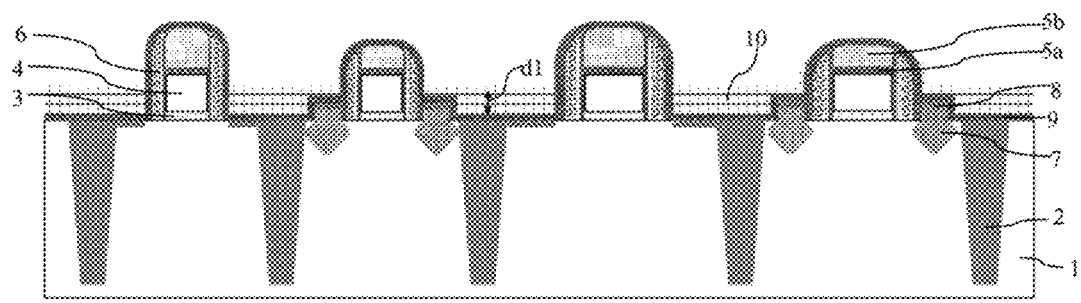
Figure 3C:
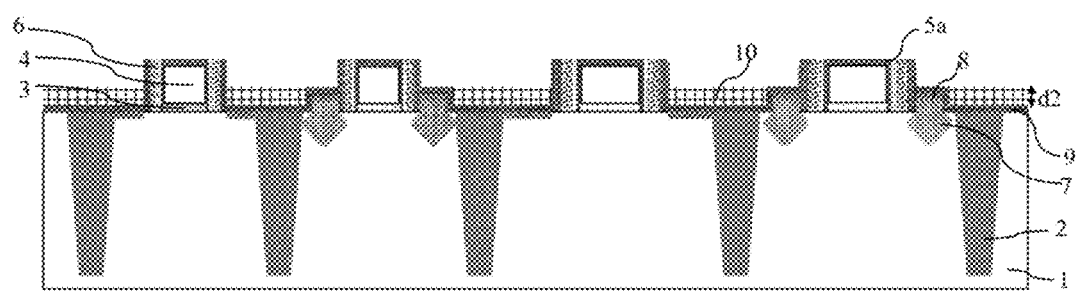

FIG. 2 shows a flowchart of a method for etching back a hard mask layer on top of dummy polysilicon gates in a gate last process according to one embodiment of the present application. FIGS. 3A to 3C illustrate cross sectional views of the device structures after some major steps of the gate last process in which etching back the hard mask layer from the top of the dummy polysilicon gates is performed, according to one embodiment of the present application. The method of etching back the hard mask layer from the top of the dummy polysilicon gates in the gate last process includes the following steps:

In step 1, referring to FIG. 3A, a plurality of dummy gate structures is formed by superposing a gate dielectric layer 3, dummy polysilicon gates 4 and a hard mask layer 5 into a stack on a semiconductor substrate 1.

Sidewalls 6 are formed on the side surfaces of each of the dummy gate structures, and the top surfaces of the sidewalls 6 are higher than the top surfaces of the dummy polysilicon gates 4 and lower than or equal to the top surface of the hard mask layer 5.

Spacing regions are formed between the sidewalls 6 of the dummy gate structures; the width of the dummy gate structures on the same semiconductor substrate includes a plurality of widths, and the width of the spacing regions includes a plurality of widths.

In one embodiment of the present application, the semiconductor substrate 1 is a silicon substrate.

The hard mask layer 5 is formed by superposing a first nitride layer 5a and a second oxide layer 5b.

The sidewalls 6 are double-layer sidewalls formed by superposing an oxide layer and a nitride layer. In other embodiments, the sidewalls 6 may also contain other structures having an oxide layer or a nitride layer, for example, single oxide layer sidewalls, single nitride layer sidewalls, or sidewalls built by superposing a number of oxide layers and nitride layers.

The gate dielectric layer 3 includes a high-dielectric-constant layer. An interface layer is disposed at the bottom of the high-dielectric-constant layer. A barrier layer is formed at the top of the high-dielectric-constant layer. The material of the high-dielectric-constant layer may be hafnium oxide (HfO2), and the interface layer may be silicon oxide (SiO2).

In one embodiment of the present application, before the dummy gate structures are formed, step 1 further includes a step of forming a field oxide layer 2 in the semiconductor substrate 1, and the field oxide layer 2 separates the active regions of devices.

The active regions include an active region corresponding to a core region and an active region corresponding to an input/output region.

The semiconductor device includes a core device and an input/output device, the core device is formed in the core region, and the input/output device is formed in the input/output region.

In one embodiment of the present application, the process node of the semiconductor device is less than 28 nm. That is, the embodiment of the present application is applicable to a 28 HK process. The 28 HK process represents a process for forming HKMG at a process node of 28 nm.

The width of the dummy gate structure of the input/output device is greater than the width of the dummy gate structure of the core device.

The core device includes a first N-type field effect transistor 301 and a first P-type field effect transistor 302.

The input/output devices include a second N-type field effect transistor 303 and a second P-type field effect transistor 304.

Step 1 further includes a step of forming P-wells and N-wells in selected regions of the semiconductor substrate 1, the P-wells are formed in the forming regions of the first N-type field effect transistor 301 and the second N-type field effect transistor 303, and the N-wells are formed in the forming region of the first P-type field effect transistor 302 and the second P-type field effect transistor 304.

After the sidewalls 6 are formed, step 1 further includes a step of forming source regions and drain regions in the active regions on the two sides of the dummy gate structures. The source regions and the drain regions are realized through corresponding source and drain implantation, the source and drain implantation of the first N-type field effect transistor 301 and the second N-type field effect transistor 303 are N-type source and drain implantation, and the source and drain implantation of the first P-type field effect transistor 302 and the second P-type field effect transistor 304 are P-type source and drain implantation. Generally, before the sidewalls 6 are formed, step 1 further includes a step of performing lightly doped drain (LDD) implantation.

The step of forming the source regions and the drain regions of the first P-type field effect transistor 302 and the second P-type field effect transistor 304 further includes a step of forming an embedded silicon germanium epitaxial layer 7. The embedded silicon germanium epitaxial layer 7 is realized by forming recesses such as Σ-shaped recesses in the two sides of the dummy gate structures corresponding to the first P-type field effect transistor 302 and the second P-type field effect transistor 304, and then filling the recesses with a silicon germanium epitaxial layer. Finally, the source regions and drain regions of the first P-type field effect transistor 302 and the second P-type field effect transistor 304 are formed in the embedded silicon germanium epitaxial layer 7. The embedded silicon germanium epitaxial layer 7 can improve the hole mobility of the P-type field effect transistors, thus improving the performance of the P-type field effect transistors. In some other embodiments, an embedded SiP epitaxial layer may also be formed in the forming regions of the source regions and drain regions of the first N-type field effect transistor 301 and the second N-type field effect transistor 303 to improve the electron mobility.

After the source regions and the drain regions are formed, step 1 further includes a step of forming salicide 8 on the surfaces of the source regions and the drain regions.

Then step 1 further includes a step of forming a third nitride layer 9, and the third nitride layer 9 covers the top surfaces of the dummy gate structures, the top surfaces of the sidewalls 6 corresponding to the dummy gate structures and the surfaces of the spacing regions.

In step 2, referring to FIG. 3A, a spin-on carbon layer 10 is deposited to completely fill and extend the spacing regions between the dummy gate structures to a position above the surface of each dummy gate structure.

In step 3, referring to FIG. 3B, no-photomask defined first etching-back is performed to the spin-on carbon layer 10, the spin-on carbon layer 10 is only located in the spacing regions and the spin-on carbon layer 10 outside the spacing regions is all removed after the first etching-back is completed.

The etch loading difference of the spin-on carbon layer 10 in the distribution regions of the dummy gate structures with different widths and the spacing regions with different widths meets the requirement of making the first etching-back be no-photomask defined one-step comprehensive etching. In other words, in the embodiment of the present application, the etch loading of the spin-on carbon layer 10 in different regions has little difference, such that the spin-on carbon layer 10 in different regions can be etched at the same etching rate, and the regions with large etch loading can be opened without adopting a photomask, that is, the embodiment of the present application can save a layer of photomask.

The thickness d1 of the spin-on carbon layer 10 after the first etching-back meets the requirement of protecting the surface structure of the semiconductor substrate 1 in the spacing regions in subsequent second etching-back.

The spin-on carbon layer 10 after the first etching-back also meets the requirement of decreasing or eliminating a spin-on carbon layer 10 residue adhered to the sidewalls 6, so as to ensure that the spin-on carbon layer 10 is all located at a position below the top surfaces of the dummy polysilicon gates 4, such that no horn is formed or the height of a horn is small in subsequent second etching-back.

Compared with the prior art, the characteristics that the etch selection ratio of the spin-on carbon layer 10 to the hard mask layer 5 adopted in the embodiment of the present application is smaller than the etch selection ratio of the photoresist to the hard mask layer can realize protecting the surface structure of the semiconductor substrate 1 on the two sides of the dummy gate structures by adopting a thinner spin-on carbon layer 10 in the second etching-back process, that is, the thickness d1 after first etching-back in the embodiment of the present application can be smaller than the thickness of the photoresist after first etching-back in the existing method, such that not only can the process window of the first etching-back be improved and the process complexity and process control difficulty be reduced, but also the protection of the surface structure of the semiconductor substrate on the two sides of the dummy gate structures can be improved in the subsequent second etching-back can be improved.

In step 4, referring to FIG. 3C, second etching-back is performed by using the spin-on carbon layer 10 as a mask to realize etching of the hard mask layer 5. The second etching-back realizes synchronous etching of the sidewalls 6 on the two sides of the hard mask layer 5 at the same time.

In one embodiment of the present application, the second etching-back process completely removes the second oxide layer 5b and the first nitride layer 5a is reserved.

Figure 1A:
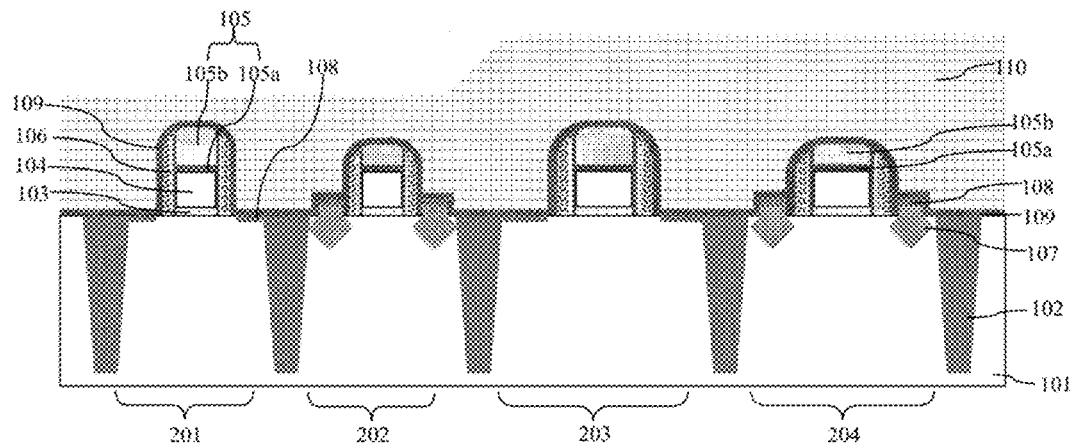
FIGS. 1A to 1D illustrate structural views of a device after each step in applying a method for etching back a hard mask layer on top of dummy polysilicon gates in a gate last process.
Figure 1B:
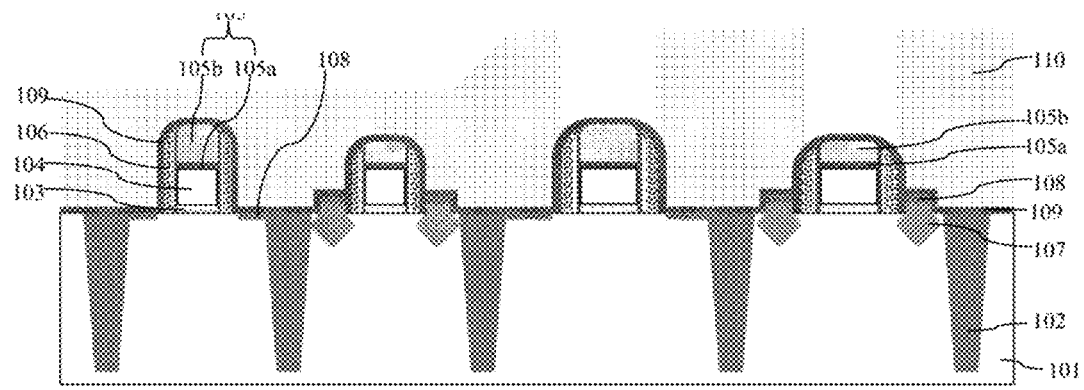
Figure 1C:
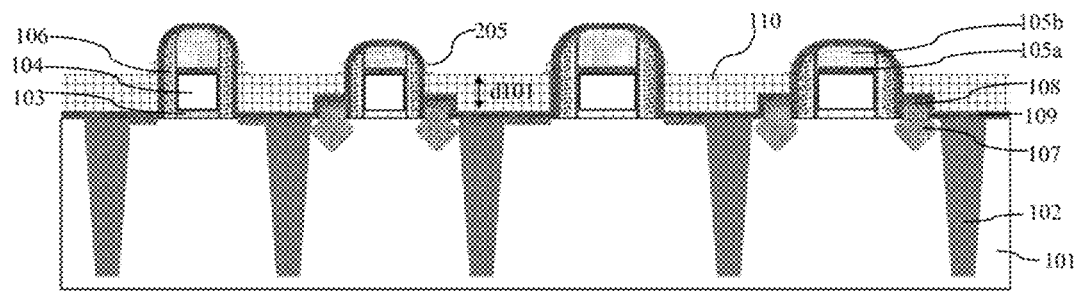
Figure 1D:
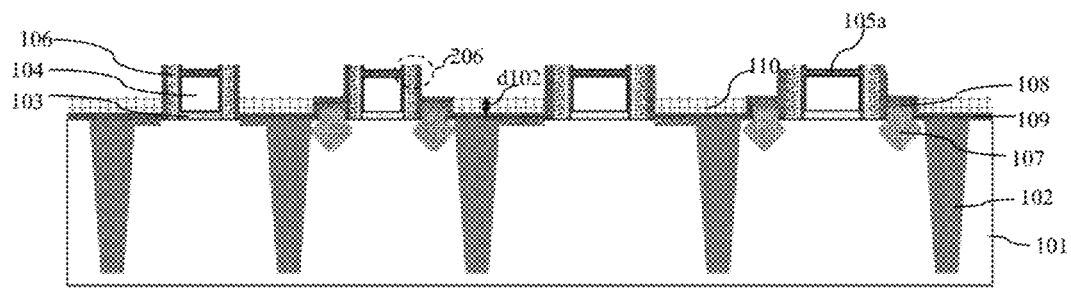

Since there is no residue of the spin-on carbon layer 10 on the side surfaces of the sidewalls 6 after the first etching-back, that is, the surfaces of the spin-on carbon layers 10 in the spacing regions are in flush, so the horn produced by the residual spin-on carbon layer 10 on the side surfaces of the sidewalls 6 can be prevented, such that finally no horn is formed in the second etching-back or the height of the horn is smaller. Compared with FIG. 1D, in the structure formed in the embodiment of the present application as illustrated in FIG. 3C, the top surfaces of the dummy gate structures after the second etching-back, i.e., the top surfaces of the first nitride layers 5a are in flush with the top surfaces of the sidewalls 6, such that polysilicon residue can be prevented from being caused when the dummy polysilicon gates 4 are removed subsequently.

In step 5, the spin-on carbon layer 10 is removed.

After step 5, the method for etching back the hard mask layer on the top of the dummy polysilicon gates in the gate last process further includes the following steps:

A contact-etch-stop-layer consisting of a nitride layer is formed.

An interlayer film is formed.

A chemical-mechanical polishing process is performed to remove the interlayer film on the top of the dummy gate structures and make the interlayer film only located in the spacing regions. The chemical-mechanical polishing process realizes removing the contact-etch-stop-layer on the top of the dummy gate structures and opening the top of the dummy polysilicon gates 4 at the same time. In the existing method, since a large horn is easily produced after the second etching-back, it is easy to cause the residue of the contact-etch-stop-layer, i.e., the nitride layer, on the top of the dummy polysilicon gates 4 in the chemical-mechanical polishing process of the interlayer film, which is not conducive to the subsequent removal of the dummy polysilicon gates. However, the embodiment of the present application can eliminate or decrease the horn after the second etching-back, so the contact-etch-stop-layer can be completely removed in the chemical-mechanical polishing process of the interlayer film, and the residual first nitride layer 5a can also be removed, such that the top surfaces of the dummy polysilicon gates 4 can be completely opened.

The dummy polysilicon gates 4 are removed.

Metal gates are formed in regions where the dummy polysilicon gates 4 are removed. Each metal gate includes a corresponding work function layer and an electrode connecting layer.

Different from the existing process in which the photoresist etching-back (PREB) process loop is adopted to etch the hard mask layer on top of the dummy polysilicon gates 4, the embodiment of the present application adopts a spin-on carbon layer 10 to replace the photoresist. The embodiment of the present application utilizes the characteristics that the etch loading difference of the spin-on carbon layer 10 in the distribution regions of the dummy gate structures of different widths and the spacing regions with different widths is small, can realize the first etching-back, i.e., the etching-back of the spin-on carbon layer 10, by adopting no-photomask defined one-step comprehensive etching. Different from that photomask definition and etching process need to be adopted to adjust the etch loading of the photoresist in different regions before the photoresist etching-back is performed in the photoresist etching-back process loop, in the present application, before the spin-on carbon layer 10 is etched back, no photomask needs to be adopted for definition. Therefore, the embodiment of the present application can save a layer of photomask, thus reducing the cost and reducing the process complexity and control difficulty.

The embodiment of the present application also utilizes the characteristics that the etch selection ratio of the spin-on carbon layer 10 to the hard mask layer 5 is smaller than the etch selection ratio of the photoresist to the hard mask layer 5, that is, the lost thickness of the spin-on carbon layer 10 is smaller than the lost thickness of the photoresist, and thus can realize protecting the surface structure of the semiconductor substrate 1 on the two sides of the dummy gate structures, such as the embedded silicon germanium epitaxial layer 7, by adopting a thinner spin-on carbon layer 10 in the second etching-back process, i.e., the etching-back process of the hard mask layer, such that the following technical effects can be further achieved at the same time:

First, compared with the existing method in which the first etching-back needs to ensure that the photoresist has a greater thickness, the etched depth of the first etching-back and the total etched range can be larger, this technique can improve the process window of the first etching-back, and can further reduce the process complexity and small process control window.

Second, the ability of protecting the surface structure of the semiconductor substrate 1 on both sides of each of the dummy gate structures will be improved, and the risk of damage to the surface structure of the semiconductor substrate 1 on both sides of each of the dummy gate structures, such as the germanium silicon epitaxial layer, can be reduced.

Third, since the thickness of the spin-on carbon layer 10 can be further reduced after the first etching-back, and the spin-on carbon layer 10 residue adhered to the sidewalls 6 can be reduced or eliminated after the thickness of the spin-on carbon layer 10 is reduced and no horn is formed or the height of the horn is smaller in the subsequent second etching-back, such that polysilicon residue can be prevented from being caused when the dummy polysilicon gates 4 are removed subsequently.

In short, the embodiment of the present application can reduce the process complexity and control difficulty by saving one photomask, thereby reducing the risk of damage to the device and improving the process window.

The present application has been described above in detail through the specific embodiments, which, however, do not constitute limitations to the present application. Without departing from the principle of the present application, those skilled in the art may make many modifications and improvements, which should also be regarded as included in the scope of protection of the present application.

The technical features of the above-mentioned embodiments can be combined arbitrarily. In order to make the description concise, not all possible combinations of the technical features of the above-mentioned embodiments are described. However, as long as there is no contradiction in the combination of these technical features, they should be considered as the range described in this specification.

The above-mentioned embodiments only express several implementation modes of the present application, and their descriptions are relatively specific and detailed, but they should not be understood as limiting the scope of the patent application. It should be pointed out that for those of ordinary skill in the art, without departing from the concept of this application, several modifications and improvements can be made, and these all fall within the protection scope of this application. Therefore, the scope of protection of the patent in this application shall be subject to the appended claims.

What is claimed is:

1. A method for semiconductor process for making a semiconductor device, comprising steps:
   step 1: forming a plurality of dummy gate structures, wherein each of the plurality of dummy gate structures is built by superposing a gate dielectric layer, dummy polysilicon gates and a hard mask layer in a stack on a semiconductor substrate, wherein each of the plurality of dummy gate structures has two side surfaces, wherein there are space regions formed between two adjacent sidewalls of the plurality of dummy gate structures; and forming sidewalls on the side surfaces of the plurality of dummy gate structures, wherein a top surface of each of the sidewalls of the plurality of dummy gate structures is higher than a top surface of each of the dummy polysilicon gates and lower than or equal to a top surface of the hard mask layer;
   wherein a first type of the plurality of dummy gate structures comprises a first pattern density and a second type of the plurality of dummy gate structures comprises a second pattern density, wherein each of the space regions of the first type of the plurality of dummy gate structures has a first width and each of the space regions of the second type of the plurality of dummy gate structures has a second width, and wherein the first width is smaller than the second width, so the first pattern density is higher than the second pattern density;
   step 2: depositing a spin-on carbon layer on the plurality of dummy gate structures, wherein the spin-on carbon layer fills the space regions between the sidewalls of the plurality of dummy gate structures to a level above the top surface of each of the plurality of dummy gate structures;
   step 3: performing a first etching-back to the spin-on carbon layer to remove the spin-on carbon layer outside the space regions and to keep the spin-on carbon layer in the space regions below the top surfaces of each of the dummy polysilicon gate, such that no residue is formed on the sidewalls of the space regions;
   wherein the spin-on carbon layer does not have an etch loading difference to different pattern densities for the first etching-back;
   step 4: performing a second etching-back by using the remaining spin-on carbon layer as a mask to remove the hard mask layer and the sidewalls of the dummy polysilicon gates on both sides of the hard mask layer at a same time,
   wherein the hard mask layer comprises a first nitride layer and a second oxide layer in a stack, and wherein the second oxide layer is removed and the first nitride layer is reserved in the second etching-back; and
   step 5: removing the remaining spin-on carbon layer.

2. The method for semiconductor process according to claim 1, wherein the semiconductor substrate comprises a silicon substrate.

3. The method for semiconductor process according to claim 1, wherein each of the sidewalls of the dummy gates include a nitride layer or an oxide layer.

4. The method for semiconductor process according to claim 1, wherein the gate dielectric layer comprises a high-dielectric-constant material.

5. The method for semiconductor process according to claim 1, wherein before forming the plurality of dummy gate structures, the step 1 further comprises a step of forming a field oxide layer in the semiconductor substrate, wherein the field oxide layer separates active regions of plurality of dummy gate structures.

6. The method for semiconductor process according to claim 5, wherein the active regions comprise core active regions of the first type of the plurality of dummy gate structures and active input/output regions of the second type of the plurality of dummy gate structures; and
   wherein the semiconductor device comprises a core device formed in the core active regions and an input/output device formed in the input/output active regions.

7. The method for semiconductor process according to claim 6, wherein the core device comprises a first N-type field effect transistor and a first P-type field effect transistor; and wherein the input/output device comprises a second N-type field effect transistor and a second P-type field effect transistor.

8. The method for semiconductor process according to claim 7, wherein the step 1 further comprises a step of forming P-wells and N-wells, wherein the P-wells are formed at the first N-type field effect transistor and the second N-type field effect transistor, and wherein the N-wells are formed at the first P-type field effect transistor and the second P-type field effect transistor.

9. The method for semiconductor process according to claim 7, wherein after forming the sidewalls, the step 1 further comprises a step of forming source regions and drain regions in the active regions at both sides of the plurality of dummy gate structures.

10. The method for semiconductor process according to claim 9, wherein the step of forming the source regions and the drain regions for the first P-type field effect transistor and the second P-type field effect transistor further comprises a step of forming an embedded silicon germanium epitaxial layer.

11. The method for semiconductor process according to claim 9, wherein after forming the source regions and the drain regions, the step 1 further comprises a step of forming salicide on surfaces of the source regions and the drain regions;
   wherein then the step 1 further comprises a step of forming a third nitride layer, wherein the third nitride layer covers the top surface of each of the plurality of the dummy gate structures, the top surfaces of the sidewalls of each of the plurality of the dummy gate structures, and surfaces of the space regions.

12. The method for semiconductor process according to claim 1, wherein after the step 5, the method further comprises:
   forming a contact-etch-stop-layer comprising a nitride layer;
   forming an interlayer film, wherein the interlayer film is only located in the space regions;
   performing a chemical-mechanical polishing process to remove the interlayer film on the top surface of the plurality of dummy gate structures, wherein the chemical-mechanical polishing process removes the contact-etch-stop-layer on the top surfaces of each of the plurality of dummy gate structures and opens a top of each of the dummy polysilicon gates at the same time;
   removing the dummy polysilicon gates; and
   forming metal gates in area where the dummy polysilicon gates are removed.

13. The method for semiconductor process according to claim 5, wherein the semiconductor device is fabricated following a gate last process node less than 28 nm.

* * * * *